United States Patent [19]

Kanai

[11] Patent Number: 4,951,602
[45] Date of Patent: Aug. 28, 1990

[54] MICROWAVE PLASMA CHEMICAL VAPOR DEPOSITION APPARATUS FOR CONTINUOUSLY PREPARING SEMICONDUCTOR DEVICES

[75] Inventor: Masahiro Kanai, Tokyo, Japan
[73] Assignee: Canon Kabushiki Kaisha, Tokyo, Japan
[21] Appl. No.: 442,511
[22] Filed: Nov. 28, 1989
[30] Foreign Application Priority Data
Nov. 29, 1988 [JP] Japan ................ 58-299585
[51] Int. Cl.⁵ ............................. C23C 16/50
[52] U.S. Cl. ........................ 118/719; 118/723
[58] Field of Search ................. 118/719, 723

[56] References Cited

U.S. PATENT DOCUMENTS

| 4,542,711 | 9/1985 | Izu | 118/719 |
| 4,601,260 | 7/1986 | Ovshinsky | 118/719 |
| 4,803,947 | 2/1989 | Ueki | 118/719 |
| 4,874,631 | 10/1989 | Jacobson | 118/719 |

Primary Examiner—Richard Bueker
Attorney, Agent, or Firm—Fitpatrick, Cella Harper & Scinto

[57] ABSTRACT

An apparatus for continuously preparing semiconductor devices each comprising a plurality of semiconductor layers being stacked on a moving substrate web; said apparatus comprising a plurality of film-forming chambers by a number equal to the number of said stacked semiconductor layers, each of said film-forming chambers having a film-forming space and beingprovided with means For evacuating said film-forming space, means for supporting said substrate web in said film-forming space, means for maintaining said substrate web at a desired temperature and means for supplying a film-forming raw material gas into said film-forming space; each of said film-forming chambers being provided with a plasma-generating chamber for generating a plasma reactive with said film-forming raw material gas to cause the formation of a semiconductior film on said substrate web in said film-forming space; said plasma-generating chamber comprising a microwave permeable bell jar disposed in a cavity resonator integrated with two impedance matching circuits in a microwave circuit, said plasma-generating chamber being provided with a porous metal thin plate adjacent to said means for supplying a film-forming raw material gas, said plasma-generating chamber being provided with means for supplying a plasma-generating raw material gas selected from the group consisting of a hydrogen gas and a gaseous mixture composed of a hydrogen gas and a rare gas into said plasma-generating chamber; said apparatus being provided with a substrate web pay-out chamber provided with a mechanism for paying out said substrate web and a substrate take-up chamber provided with a mechanism for taking up said substrate web; said apparatus being provided with a substrate web-processing chamber at least between said substrate web pay-out chamber and the first film-forming chamber; each two of said chambers being connected by means of a connection pipe through which said substrate web can be moved; and said connection pipe being provided with means for preventing the gas of one of said chambers from entering into other chamber with an inert gas.

7 Claims, 10 Drawing Sheets

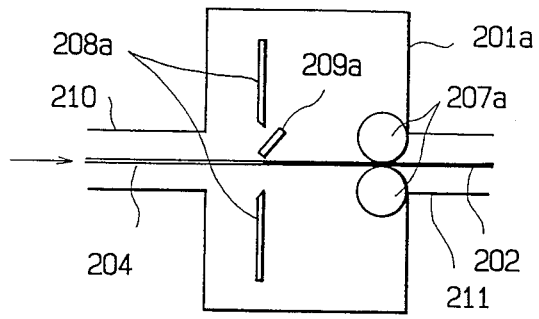
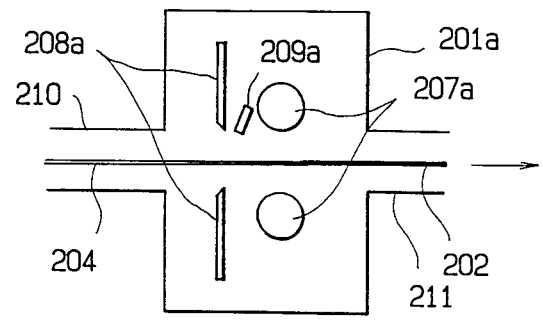

MICROWAVE PLASMA CHEMICAL VAPOR DEPOSITION APPARATUS FOR CONTINUOUSLY PREPARING SEMICONDUCTOR DEVICES

FIELD OF THE INVENTION

The present invention relates to an improved microwave plasma chemical vapor deposition apparatus suitable for continuously preparing semiconductor devices such as photoelectromotive force devices, image input line sensors, image pickup devices, photosensitive devices or the like.

BACKGROUND OF THE INVENTION

For preparing semiconductor thin films, various film-forming processes have been employed in accordance with desired electrical or physical properties and in view of application uses.

For instance, there have been tried a plasma CVD process, reactive sputtering process, ion plating process, light CVD process, thermal CVD process, MOCVD process, MBE process, etc. Several of the above mentioned processes have now been employed and industrialized as optimum to forming semiconductor devices.

Among all, production apparatus using the plasma CVD process have been employed most generally and, for instance, amorphous silicon solar cells of large area have been produced mainly by a multi-separated chambers system (Japanese Patent Laid-Open Sho 59-61078) or a roll-to-roll system (U.S. Pat. No. 4,485,125 and Japanese Patent Publication Sho 62-43554). However, the photoelectric conversion efficiency of the thus produced solar cells is considerably lower as compared with that of an amorphous silicon solar cell of small area prepared in a laboratory. The reason is attributable, in the multi-separated chambers system, to that stability and homogenity of plasmas can no more be maintained upon forming deposited films along with increasing the area of RF discharge electrode and that an increase in the size of a film-forming chamber for forming the deposited film makes it difficult to remove impurities from the circumferential walls of the film-forming chamber, etc. and thus increasing the amount of the impurities incorporated into the deposited films. In the roll-to-roll system, although the reduction in the photoelectric conversion efficiency is rather improved as compared with that in the multi-separated chambers system, there is still a problem caused by the sliding movement of a substrate, that the plasmas lack in stability or a special device is required for the mutual diffusion of gases between each of the film-forming chambers.

Further, from a view point of production efficiency, there is a limit for the size of the discharge electrode in order to maintain the stability and the homogenity of the plasma in the multi-separated chambers system and there is also a restriction for the area of a solar cell that can be produced per one batch. Further, since it is necessary for evacuation of starting material gas, equalization of pressure, control for the substrate temperature, stabilization for the amount of starting gas introduced and matching control accompanying the initiation of the electric discharge, repeatingly, on every time between film-forming chambers in adjacent with each other upon transportation of the substrate, which makes it difficult to reduce the production cost and requires much step control also in maintaining the reproducibility.

Further, in the roll-to-roll system, since it is necessary for leaking the inside of all the film-forming chambers to atmospheric air, cleaning each of the film-forming chambers, replacing rolls, on every completion of the film-formation per one roll, it requires much time for the maintenance of the apparatus. In addition, since the film-forming chamber is exposed to the atmospheric air on every step, it requires a long time for setting up the chamber to a sufficient degree of vacuum and much care has to be taken for administration of reproducibility of the vacuum state (for example, degree of vacuum attained).

Furthermore, although RF power is used as the plasma-generating energy, in each of the foregoing production apparatus, it can not always be said that the electrical or physical properties of the deposited films formed by such plasma CVD process are satisfactory for forming semiconductor devices. Further, plasma stability or reproducibility during formation of the deposited film over a long period of time may occasionally become poor and this sometimes leads to one of major factors for remarkably reducing the production yield.

As means for overcoming such problems, Japanese Patent Laid-Open Sho 60-41047, for example, discloses a method of improving the productivity of group IV semiconductor films at high quality by increasing the film deposition rate upon forming the films by means of HR-CVD process (Hydrogen Radical Assisted CVD process).

Further, Japanese Patent Laid-Open Sho 55-141729 and Sho 57-133636, etc. have proposed a method of disposing electromagnets at the pheriphery of a cavity resonator and establishing conditions for ECR (Electron Cyclotron Resonance) as means for efficiently forming high density plasmas by using a microwave of about 2.45 GHz. Further, it has been reported in academic meetings, etc. that various kinds of semiconductor thin films have been prepared by utilizing the high density plasmas. And microwave plasma CVD apparatus of this kind have already been commercially available at present.

Incidentally, in the HR-CVD process described above, hydrogen atoms in the excited state (hydrogen radicals) play an important role for the control in the film property and homogenity regarding the formation of a deposited film. However, there has not yet been made a sufficient study but left a room for the improvement on the method of producing the hydrogen atoms in the excited state in a great amount and homogenously and controlling the excited state thereof upon forming the deposited film, thereby controlling the chemical reactions upon forming the deposited film so that the property of a deposited film to be obtained be controlled optionally and stably.

On the other hand, in the microwave plasma CVD apparatus utilizing ECR, it is necessary to maintain the inner pressure of the plasma-forming chamber at less than about $10^{-3}$ Torr for establishing the ECR conditions, which restricts the inner pressure upon forming a deposited film. Further, under such a level of pressure, the mean free path of gas molecules becomes longer (up to 1 m) and because of this, the starting material gas for forming the deposited film diffuses near the microwave introducing window and is decomposed to thereby adhere deposits on the surface of the microwave introducing window or the cavity resonator, whereby making electric discharge instable or causing contamination of foreign matters into a deposited film formed on the substrate due to defoliation and scattering of the adhered deposits. Further, plasmas generated in the plasma forming chamber diverge along the diverging magnetic field of electromagnets disposed to the inside of the film-forming chamber and, thus, the substrate is exposed to the plasmas at a relatively high density. Accordingly, the deposited film easily undergo damages such as of charged particles to impose a limit on the improvement of the quality. In the step of stacking a plurality of deposited films at the time of preparing a semiconductor device, the interface property is likely to reduce due to the damages caused by the charged particles, etc., failing to improve the properties of the semiconductor device obtained.

SUMMARY OF THE INVENTION

The object of the present invention is to overcome the foregoing various problems in the conventional apparatus for producing a semi-conductor device and to provide an improved apparatus which enables one to continuously and stably produce semiconductor devices of high quality, with good homogenity and at good reproducibility.

The present inventor has made earnest studies for dissolving the foregoing various problems in the conventional apparatus for forming semiconductor devices, and attaining the foregoing object of the present invention and, as a result, has obtained a knowledge that hydrogen atoms in an optionally excited state can be supplied stably, with good reproducibility and efficiently by providing a plasma forming chamber in a cavity resonator integrated with two impedance matching circuits in a microwave circuit and conducting microwave plasma discharge by using a hydrogen gas or a gas mixture comprising a hydrogen gas and a rare gas.

The apparatus for continously forming semiconductor devices according to the present invention has been accomplished based on the above finding and as a result of further studies.

The features of the present invention are as described below.

That is, an apparatus for continuously forming semiconductor devices comprising film-forming chambers by a number equal to the number of semiconductor layers to be stacked for forming a semiconductor device, a pair of substrate web containers disposed on both sides of the plurality of film-forming chambers, at least one substrate web processing chamber disposed between the substrate web container and the film-forming chamber, a connection pipe having a slit-like cross sectional shape for connecting a plurality of film-forming chambers to each other and means for continuously moving a substrate web, in which the substrate web is moved continuously in the longitudinal direction from one of the substrate web containers by way of the plurality of film-forming chambers and connection pipes to other of the substrate web containers thereby enabling to form semiconductor layers continuously on the substrate web, wherein a plasma forming chamber disposed in a cavity resonator integrated with two impedance matching circuits in a microwave circuit is connected to at least one of the plurality of film-forming chambers, the plasma forming chamber is constituted with a microwave permeable bell jar and a porous metal thin plate, the plasma-forming chamber is connected so as to oppose to the substrate web moving in the film-forming chamber by way of the porous metal thin plate, so that the semiconductor layers can be formed on the substrate web by chemical reaction between the starting material compound capable of contributing to the formation of the semiconductor layer and hydrogen atoms in the excited state formed in the plasma forming chamber.

The impedance matching conditions in the cavity resonator integrated with the two impedance matching circuits in the microwave circuit are controlled by any one of the following two combinations:

(1) A combination of a cavity length variable plunger disposed in the cavity resonator and a restriction disposed at the connection portion between a microwave guide and the cavity resonator.

(2) A combination of the cavity length variable plunger and an E-H tuner or a three stub tuner disposed on the microwave guide.

The excited state of the hydrogen atoms established in the plasma-forming chamber in the apparatus according to the present invention is controlled by measuring the light emission intensities of the $H_\alpha$ and $H_\beta$ formed as a result of excitation of the hydrogen gas by means of light emission spectroscopy and by controlling one or more of the parameters concerned i.e. microwave power applied into the cavity resonator, impedance matching condition, flow rate of hydrogen gas or flow ratio of hydrogen gas to rare gas and the total pressure.

Further, the substrate web is to move at an angle within 30° relative to the horizontal axis in the plane of the porous metal thin plate and at a position within 100 mm from the surface of the porous metal thin plate, and a raw material gas for forming the semiconductor laYer is introduced into the film-forming chamber in the gaseous state or in the state excited in an activation chamber disposed separately from and in adjacent with the film-forming chamber by gas blowing means disposed between the porous metal thin plate and the substrate web.

Furthermore, at least a vacuum sealing jig, substrate web cutting jig and substrate web connecting jig are incorporated in the substrate web processing chamber in the present invention.

Further, a rare gas introduction pipe is connected with the connection pipe having a slit-like cross sectional shape.

Further, evacuation means and a pressure regulator independent from each other are provided with the film-forming chamber and the substrate web container.

According to the apparatus for continuously forming semiconductor devices of the present invention, it is possible to continuously form deposited semiconductor films of high quality having desired properties such as crystallinity and hydrogen content with good homogenity, at high efficiency and with good reproducibility.

Further, the film quality can be controlled easily and stably and good reproducibility can be attained by controlling the excited state of the hydrogen atoms and controlling the excited state of the raw material gas or/and the amount of the raw material gas to be introduced.

Further, since so-called polysilane powder is less formed during formation of the deposited films, abnormal growth of a film to be formed due to scattering and adhesion of deposits is reduced and because of this, occurrence of defects (short-circuits, etc.) upon forming a semiconductor device such as solar cells is reduced. Furthermore, the amount of deposits adhered on the wall surfaces of the film-forming chamber is also reduced and, thus, the cleaning frequency of the film-forming chamber is reduced to improve the production tact.

Furthermore, it is possible to unify the properties of the substrate web over the entire surface and improve the production yield due to the reduction in the portions to be wasted.

Separately, it is possible to form a desirable deposited film even on an inexpensive resin substrate and this makes it possible to reduce the production cost for solar cell modules.

BRIEF DESCRIPTION OF THE DRAWINGS

FIGS. 2(A) through 2(J) are schematic views for illustrating the operations in the substrate web processing chamber in the present invention

DESCRIPTION OF THE INVENTION

Figure 1:
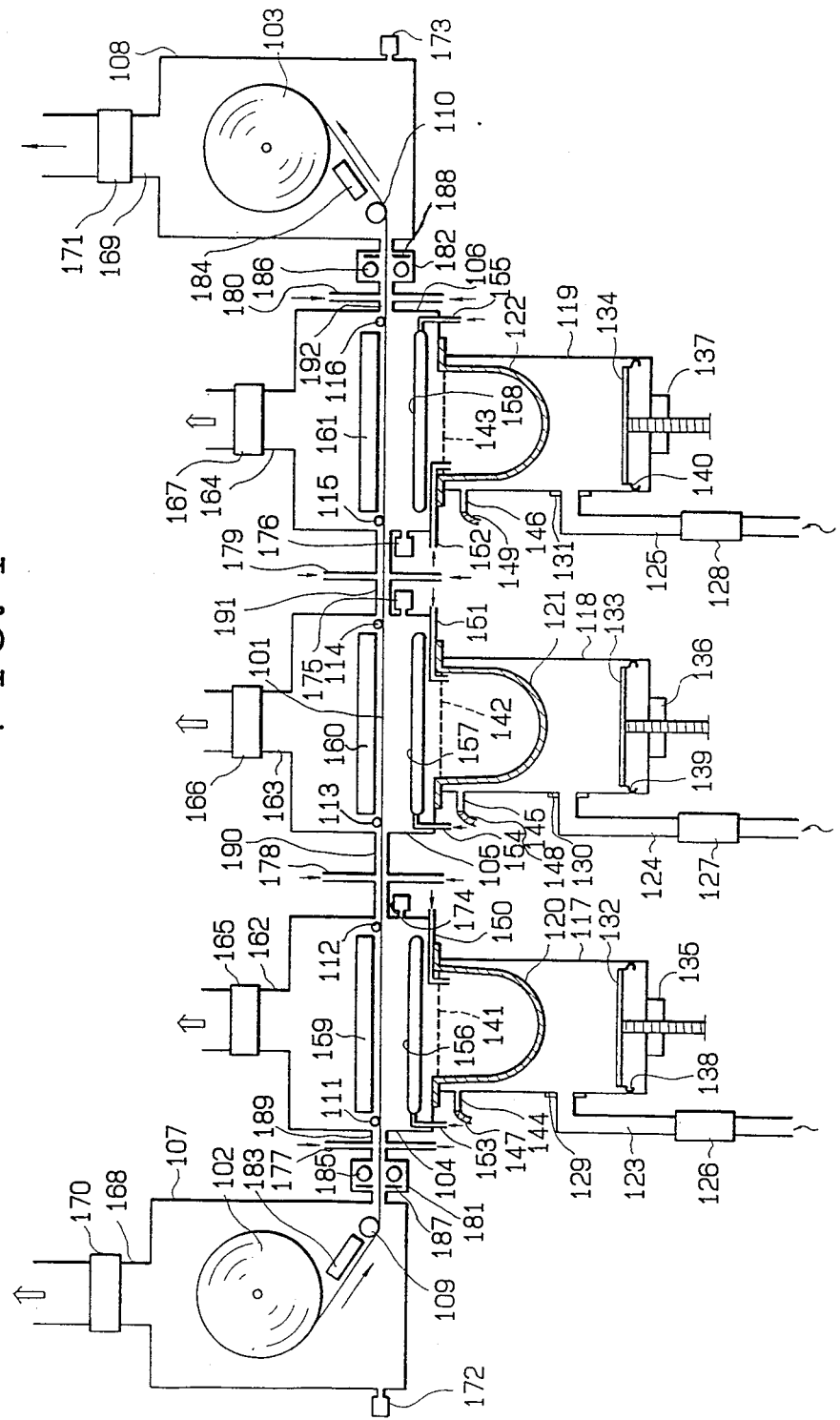
FIG. 1 is a schematic cross sectional view for the constitution of a typical embodiment of the apparatus for continuously forming semiconductor devices according to the present invention, in a case of forming a semiconductor device comprising three semiconductor layers being stacked

The apparatus according to the present invention is to be described specifically.

A first feature of the apparatus for continuously forming semiconductor devices according to the present invention resides in that film-forming chambers are disposed by a number equal to that of the semiconductor layers constituting a semiconductor device. That is, each of the semiconductor layers is formed in each of the exclusive film-forming chambers. For instance, in the case of forming a pin type photoelectromotive force device, three film-forming chambers are used exclusively for forming a p-type semiconductor layer, an i-type semiconductor layer and an n-semiconductor layer respectively and the respective film-forming chambers are connected by way of connection pipes each having a slit-like cross sectional shape. Further, in order to prevent one or more film-forming raw material gases used in each of the film-forming chambers from diffusing into other film-forming chambers, a rare gas introduction pipe is disposed to the connection pipe, through which a rare gas is introduced. The rare gas to be introduced is selected from those giving less effect to the property of the semiconductor thin film. For instance, He, Ne, Ar, Kr, Xe or Rn can be mentioned as a preferred gas and the gas can be used after diluted with $H_2$ gas.

The extent of diffusion and intrusion of the film-forming raw material gas in each of the film-forming spaces can be confirmed by measuring the gas ingredients in each of the film-forming chambers by means of a mass spectrometer and the feed-back can be applied to the amount of the rare gas to be introduced.

In this way, it is possible to prevent cross-contamination of the film-forming raw material gases used in each of the film-forming spaces, by which various properties of the semiconductor device can be improved.

Further, the second feature of the apparatus according to the present invention resides in that at least one substrate web processing chamber is disposed between a substrate web container and the film-forming chamber.

The substrate web processing chamber will be later described more in detail with reference to FIG. 2. In the substrate web processing chamber, there are installed at least a vacuum sealing jig, a substrate web cutting jig and a substrate web connecting jig. By disposing the substrate web processing chamber, it is possible to leak the inside of the substrate web container to the atmospheric air without breaking the vacuum of the film-forming chamber and to replace rolls for the substrate web.

Further, the third feature of the apparatus according to the present invention resides in using a cavity resonator structure integrated with two impedance matching circuits in a microwave circuit.

Referring to the structure, the present inventor has firstly found that it is effective to dispose a bell jar constituting a plasma-forming chamber in a cavity resonator for exciting TM mode, as a structure capable of operating as the cavity resonator irrespective of the absence or presence and the density of plasmas.

The structure of the apparatus mentioned here is as described below. That is, a cavity length variable plunger is disposed in a cavity resonator structure and, as shown in FIG. 1, a rectangular wave guide and a cylindrical cavity resonator are connected such that the central axes thereof are in perpendicular to each other. Then, in the case of matching impedance, any one of the following combinations is preferably employed. That is, a combination of the cavity length variable plunger with a restriction or with an E-H tuner or with three stab tuner disposed at a connected portion between the rectangular wave guide and the cavity resonator.

The bell jar disposed in the cavity resonator for forming plasma is composed of microwave permeable but gas sealable material, for example, so-called new ceramics such as quartz ($SiO_2$), alumina ceramics ($Al_2O_3$), boron nitride (BN), silicon nitrite ($Si_3N_4$). silicon carbide (SiC), beryllia (BeO), magnesia (MgO) and zirconia ($ZrO_2$).

The cavity length variable plunger is disposed to the bell jar on the side where the microwave is introduced, that is, on the side of the atmospheric air. Accordingly, since the impedance can be matched by varying the cavity length in the atmospheric air, it is possible to easily adjust the cavity length relative to the change of the cavity resonance conditions caused by the change such as absence or presence of plasma or change of the plasma density and generate microwave plasmas with good reproducibility and stability.

In the apparatus according to the present invention, since a porous metal thin plate disposed between the bell jar and the film-forming space acts as an end face plate for establishing the cavity resonance conditions, it is desirable that the size of apertures in the porous metal thin plate is, preferably, less than λ/2, optimally, less than λ/4 relative to the wavelength (λ) of microwave in the tube.

The porous metal thin plate may be of a metal gauge-like shape or a thin metal plate-like shape apertured with circular or polygonal holes. The plate may be made of a metal or alloy such as Al, Fe, Ni, Ti, Mo, W, Pt, Au, Ag and stainless steel. In alternative, it may be made of composite material of glass, ceramic or metal applied with surface treatment with such metal as described above by means of plating, sputtering, vapor deposition, etc.

Further, the diameter and the distribution of the apertures in the porous metal thin plate are preferably varied so as to efficiently and uniformly introducing hydrogen atoms in the excited state formed in the bell jar. The entire pore ratio is preferably 10% or more, more preferably, 20% or more, and most preferably, 30% or more.

When desired semiconductor thin films are continuously formed by the apparatus according to the present invention having the foregoing features, semiconductor thin films are formed on a substrate web by introducing one or more film-forming raw material gases into the film-forming space in the gaseous state or in the activated state and, separately introducing hydrogen atoms controlled to the excited state and chemically reacting them. The crystallinity, hydrogen content, etc. of the resulting semiconductor thin films can be controlled stably and with good reproducibility by properly controlling the excited state of the hydrogen atoms.

The excited state of the atomic hydrogen in the present invention is determined from light emission observed in the microwave plasmas of a hydrogen gas or a gas mixture of a hydrogen gas and a rare gas. Specifically, light emission from the microwave plasmas is measured by emission spectroscopy, and the excited state is determined based on the intensity ratio between the emission lines at 656 nm belonging to $H_\alpha$ and at 486 nm belonging to $H_\beta$ among the emission lines of atomic hydrogen (H*), and at least one of the following parameters concerned: microwave power applied into the cavity resonator; the impedance matching condition; flow rate of the hydrogen gas to be introduced; flow rate of the hydrogen gas to the rare gas; and the total pressure, is controlled so as to attain a desired intensity ratio.

In the present invention, for controlling the excited state of hydrogen atoms, it is desirable that the intensity ratio of $H_\alpha/H_\beta$ is controlled, preferably, to be in the range of 1/1 to 1000/1 and, more preferably, in the range of 10/1 to 500/1.

Within the range of the above-mentioned intensity ratio, the factor for determinating the quality of the resulting semiconductor film also lies in a desirable combination of the kind of the substrate and the substrate temperature. In the present invention, it is necessary to use an emission spectrophotometer having a sensitivity capable of measuring the intensity ratio described above.

In the apparatus according to the present invention, a microwave plasma monitor is disposed upstream to the gas blowing means for the film-forming raw material gas relative to the flowing direction of the entire gases, deposited films are not substantially formed thereon and it is possible to conduct stable monitoring from the start of the film formation till the completion thereof.

In order to form hydrogen atoms in the excited state in the apparatus according to the present invention, hydrogen gas or a gaseous mixture composed of hydrogen gas and a rare gas is used. In the case where microwave plasmas are not stabilized or the plasmas are not formed only with the use of hydrogen gas, it is effective to use a rare gas in combination with the hydrogen gas.

Preferable examples of such rare gas are He, Ne, Ar, Kr, Xe and Rn.

The apparatus according to the present invention enables one to continuously form various semiconductor thin films. As those films, there can be mentioned so-called group IV semiconductor films of Si, Ge or C; so-called group IV semiconductor films of SiGe, SiC or SiSn; so-called III-V group semiconductor films of GaAs, GaP, GaSb, InP or InAs, as well as so-called group II-VI semiconductor films of ZnSe, ZnS, ZnTe, CdS, CdSe or CdTe.

As the raw material for forming these semiconductor films, there can be mentioned hydrides, halides and organic metal compounds, etc. of the constituent elements for the semiconductor films described above. These compounds are selectively used depending upon the kind of a semiconductor film to be formed Any of these compounds is introduced in the gaseous state or activated state into the film-forming space.

It is a matter of course that these compounds can be used alone or in combination of two or more of them.

According to the apparatus of the present invention, it is possible to conduct valence election control or forbidden band control for a semiconductor film to be formed. In the case of conducting the valence electron control for a semiconductor film to be formed, a proper raw material gas capable of imparting a valence electron controlling agent is mixed with the film-forming raw material gas or the hydrogen gas and introduced into the film-forming space. Likewise, in the case of conducting the forbidden band control for a semiconductor film to be formed, a proper raw material gas capable of imparting a forbidden band controlling agent is introduced into the film-forming space in the same manner as in the foregoing case.

As the substrate web used in the present invention, there can be mentioned, for example, those made of metal or resin material having a tensile strength and a desired thickness capable of being wound up into a roll-shape, which may be electroconductive or insulative.

The substrate web is delivered through a pair of containers disposed on both sides of film-forming chambers by a number corresponding to that of the semiconductor layers and moved at a certain speed by a take-up mechanism.

DESCRIPTION OF THE PREFERRED EMBODIMENTS

The apparatus for continuously preparing semiconductor devices according to the present invention is to be described specifically referring to the drawings but the invention is no way restricted only thereto.

FIRST EMBODIMENT

FIG. 1 is a schematic cross sectional view illustrating a typical embodiment of the apparatus according to the present invention which is capable of continuously preparing semiconductor devices of three layered structure.

The apparatus of the present invention shown in FIG. 1 comprises an initial container 107 for a subs&rate web 101, a first film-forming chamber 104, a second film-forming chamber 105, a third film-forming chamber 106 and a terminal container 108 for said substrate web being arranged in this order. The initial container 107 is connected through a connection pipe 189 to the first film-forming chamber 104. The first film-forming chamber 104 is connected through a connection pipe 190 to the second film-forming chamber 105. The second film-forming chamber 105 is connected through a connection pipe 191 to the third film-forming chamber 106. And, the third film-forming chamber 106 is connected through a connection pipe 192 to the terminal container 108. Numeral reference 101 stands for a substrate web, which is delivered by means of a pay-out mechanism 102 in the direction of an arrow shown in the drawing, supported on support rollers 109, 111, 112, 113, 114, 115, 116 and 110, and then taken up by a take-up mechanism 103 in the direction of an arrow also shown in the drawing. Meanwhile, the substrate web 101 is heated by a pre-heating mechanism 183, maintained at desired film-forming temperatures in the respective film-forming chambers by means of heating mechanisms 159, 160 and 161, cooled by a cooling mechanism 184 and then taken-up. Further, the advancing direction and the tension of the substrate web 101 can optionally be set by the rotating directions of the pay-out mechanism 102 and the take-up mechanism 103.

The connection pipe 189 is provided with a first substrate web processing chamber 181 en route to the first film-forming chamber 104. The first substrate web processing chamber 181 contains a pair of rollers 185 made of a fluorine-contained rubber (trade name: VITON, product of E. I. du Pont de Nemours and Co.), a pair of cutting blades 187 and a welding jig (not shown). Likewise, the connection pipe 192 is provided with a second substrate web processing chamber 182 en route to the terminal container 108. The second substrate web processing chamber 182 contains a pair of rollers 186 made of the foregoing fluorine-contained robber, a pair of cutting blades 188 and a welding jig (not shown).

With each of the connection pipes 189, 190, 191 and 192, there is provided a gas gate 177, 178, 179 or 180 though which a rare gas is passed in order to prevent the gases of the adjacent chambers from mixing each other. Each of numeral references 172, 173, 174, 175 and 17 stands for a vacuum gage which is provided with the initial container 107, the terminal container 108, the first film-forming chamber 104, the second film-forming chamber 105, or the third film-forming chamber 106.

Each of numeral references 162, 163 and 164 stands for an exhaust pipe being connected through a pressure controlling valve 165, 166 or 167 to an exhaust device (not shown), which is provided with the first film-forming chamber 104, the second film-forming chamber 105 or the third film-forming chamber 106. Likewise, each of numeral references 168 and 169 stands for an exhaust pipe being connected through a pressure controlling valve 170 or 171 to an exhaust device (not shown), which is provided with the initial container 107 or the terminal container 108.

Numeral references 117, 118 and 119 stand for, respectively, cylindrical cavity resonators for the first, second and third film-forming chambers 104, 105 and 106. Each of the cylindrical cavity resonators 117, 118 and 119 comprises a bell jar (120, 121 or 122) as a microwave plasma generating chamber; a porous metal thin plate (141, 142 or 143); a cavity length variable plunger (132, 133 or 134); a rectangular wave guide (123, 124 or 125); and a restriction (129, 130 of 131) as the main components. Numeral references 138, 139 and 140 stand for springs made of bronze which are disposed for ensuring contact between the plungers 132, 133 and 134 and the cylindrical cavity resonators 117, 118 and 119, respectively, in order to prevent abnormal electric discharge. Each of the cavity length variable plungers 132, 133 and 134 can be moved toward the bell jars 120, 121 and 122 by means of motors 135, 136 and 137 respectively. Numeral references 126, 127 and 128 stand for E-H tuners or three-stub tuners, as one of impedance matching circuits for constituting the microwave circuit in the present invention. They are used for the impedance matching being paired with each of the cavity length variable plungers 132, 133 and 134 as one of the other impedance matching circuits.

The restrictions 129, 130 and 131 are also one of the impedance matching circuits and each of them is used being paired with each of the cavity length variable plungers 132, 133 and 134.

Each of the restrictions 129, 130 and 131 is disposed as a vertical pair at the connection portion between the rectangular wave guide 123, 124 or 125 and the cylindrical cavity resonator 117, 118 or 119. The paired members are adapted so as to be slidable, independent of each other, vertically along the cylindrical surface and the cylindrical cavity resonator 117, 118 or 119. They are kept in contact with the cylindrical cavity resonator 117, 118 or 119 by means of a bronze spring (not illustrated).

Each of numeral references 150, 151 and 152 stands for a gas feed pipe for a hydrogen gas on a gaseous mixture composed of a hydrogen gas and a rare gas, which is extended from a reservoir (not shown). The gas feed pipe (150, 151, 152) is extended through the porous metal thin plate (141, 142, 143) and opened into the bel jar (120, 121, 122) so that a hydrogen gas on a gaseous mixture composed of a hydrogen gas and a rare gas can be effectively supplied thereinto from the gas feed pipe and converted into plasmas with the action of microwave energy applied thereto to cause hydrogen atoms, etc. in the excited state, which are successively passed through the porous metal thin plate (141, 142, 143) into the film-forming chamber (104, 105, 106). On the other hand, a film-forming raw material gas is supplied into the film-forming chamber (104, 105, 106) through a plurality of gas liberation holes (not shown) of a gas feed pipe (156, 157, 158) extended through a gas introducing pipe (153, 154, 155) from a reservoir (not shown).

Each of the gas feed pipes 156, 157 and 158 is provided between the substrate web 101 and the porous metal thin place 141, 142 or 143.

Thus, the film-forming raw material gas thus supplied is reacted with the foregoing hydrogen atoms in the excited state to cause the formation of a deposited film on the substrate web being maintained at a desired temperature.

As for the film-forming raw material gas, it is possible to be previously activated with the action of a proper activation energy of light, heat or electric discharge to form active species, followed by supplying the resultant active species into the film-forming chamber (104, 105, 106) through the gas feed pipe (156, 157, 158). In this case, an activation chamber for forming such active species is desired to be provided at the midway of the gas introducing pipe (153, 154, 155). The gaseous pressure of the film-forming chamber (104, 105, 106) at the time of forming the deposited film on the substrate web 101 is maintaining at a desired value by regulating the pressure controlling valve (165, 166,167) while measuring said gaseous pressure by the pressure gage (174, 175, 176).

Each of numeral references 144, 145 and 146 stands for a port provided with the cylindrical cavity resonator (117, 118, 119), which serves to monitor the situation of microwave plasmas generated therein.

The port (144, 145, 146) is attached with a light collecting probe (not shown), to which a quartz fiber (147, 148, 149) is connected. The quartz fiber (147,148, 149) is connected to a spectroscope (not shown) for conducting emission spectral analysis.

One of the features of the apparatus according to the present invention is to have the first and second substrate web processing chambers 181 and 182.

FIG. 2(A) through FIG. 2(J) are, respectively, schematic views for illustrating the outline of the substrate web processing chamber and the operation of the substrate web upon film-formation.

In FIG. 2, 201a represents the foregoing first substrate web processing chamber disposed on the side of deliverying the substrate web and 201b represents the foregoing second substrate web processing chamber disposed on the side of taking-up the substrate web, in which are contained a pair of rollers 207a or a pair of rollers 207b, respectively made of the foregoing fluorine-contained rubber, a pair of cutting blades 208a or 208b and a welding jig 209a or 209b.

Figure 2A:
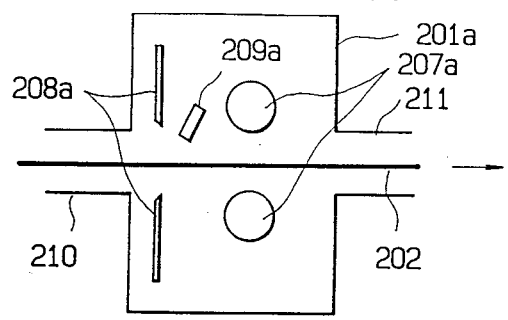

That is, FIG. 2(A) shows a state of the usual film-formation, in which the substrate web 202 is moving in the direction of an arrow, and the rollers 207a, the cutting blades 208a and the welding jig 209a are not in contact with the substrate web 202. Numeral reference 210 represents the foregoing connection pipe with the foregoing initial substrate web container. Numeral reference 211 represents the foregoing connection pipe with the foregoing first film-forming chamber.

Figure 2B:
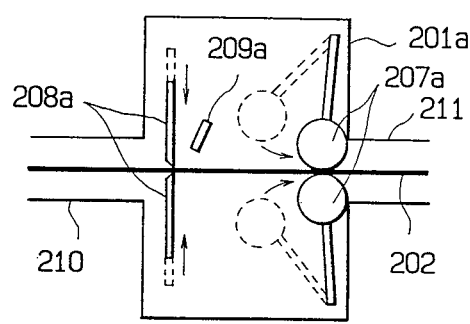

FIG. 2(B) shows a first step for replacing with a new substrate web after the completion of the film-forming step to one roll of the substrate web. At first, the substrate web 202 is stopped, and the rollers 207a are moved from the positions shown by the dotted lines along the directions of arrows shown in the figure, thereby brought into closely contact with the substrate web 202 and the wall of the substrate web processing chamber 201a. In this state, the initial substrate web container and the first film-forming chamber are separated in a gas sealed manner of operating the foregoing gas gate. Then, the pair of cutting blades 208a are operated in the directions of arrows to cut the substrate web 202. The cutting blades 208a are constituted so as to mechanically, electrically or thermally cut the substrate web 202.

Figure 2C:
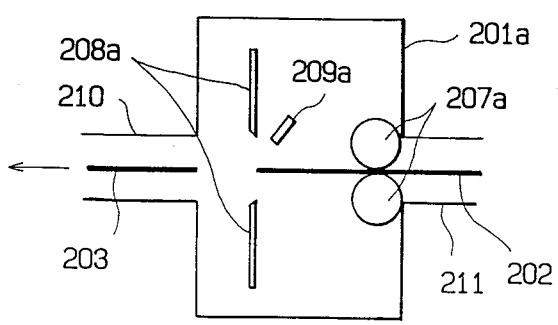

FIG. 2(C) shows a state in which the cut and separated substrate web 203 is taken up on the side of the initial substrate web container.

The above cutting and taking-up steps can be conducted at the inside of the initial substrate web container under a vacuum state or under a state of leaking to atmospheric air.

FIG. 2(D) shows a step in which a new substrate web 204 is supplied and connected with the former substrate web 202. The substrate webs 204 and 202 are brought into contact at the ends thereof and then connected by welsion using the welding jig 209a.

FIG. 2(E) shows a state in which the inside of the first substrate web container (not shown) is evacuated to reduce the pressure difference relative to the first film-forming chamber sufficiently and, thereafter, the pair of roller 207a are aparted from the substrate wet 202 and the substrate webs 202 and 204 are taken up.

Then, description is to be made for the operation on the side of taking-up the substrate web.

Figure 2F:
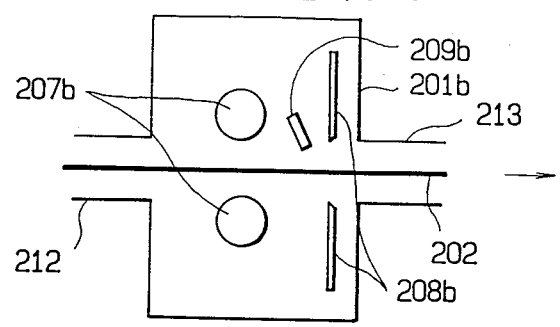

FIG. 2(F) shows a usual film-forming state, in which respective jigs are disposed substantially in symmetry with those described in FIG. 2(A).

Figure 2G:
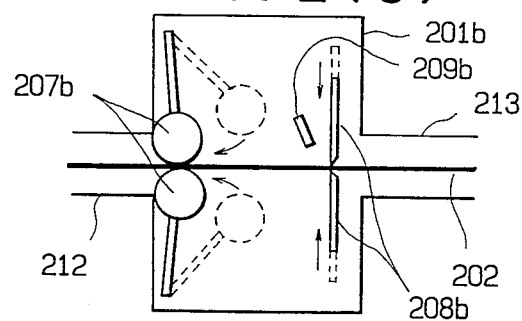

FIG. 2(G) shows a step for taking out one roll of a substrate web after the completion of the film formation thereto, and placing an empty bobbin for taking-up the substrate web applied with the subsequent film-forming step.

At first, the substrate web 202 is stopped, and the pair of rollers 207b are moved from the positions shown by the dotted lines along the directions of arrows shown in the figure and are brought into close contact with the substrate web 202 and the wall of the second substrate web processing chamber 201b. In this state, the foregoing terminal substrate web container and the foregoing third film-forming chamber are separated in a gas tight manner of operating the foregoing gas gate. Then, the pair of cutting blades 208b are moved in the directions of arrows to cut the substrate web 202. The cutting blades 208b are constituted with any one of those capable of mechanically, electrically or thermally cutting the substrate web 202.

Figure 2H:
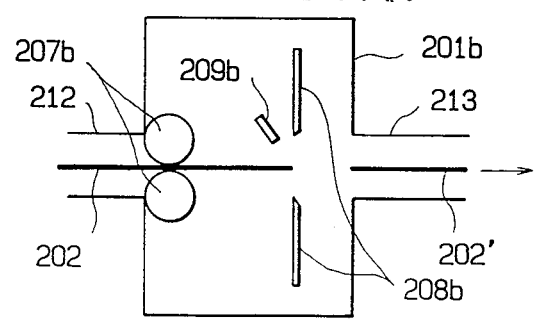

FIG. 2(H) shows the state in which the cut substrate web 202' after the completion of the film-forming step is taken up on the side of the terminal substrate web container.

The above cutting and taking-up steps can be conducted at the inside of the terminal substrate web container under an evacuated state or under a state of leaking to atmospheric.

Figure 2I:
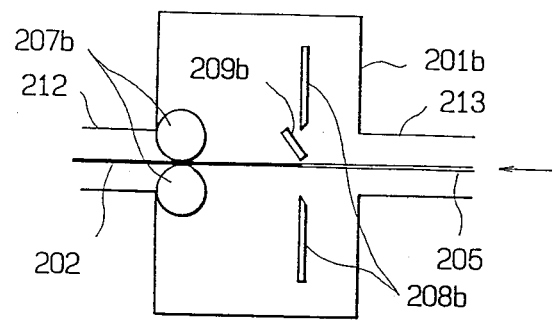

FIG. 2(I) shows a step in which a stand-by substrate web 205 for taking-up use attached to a new taking-up bobbin is supplied and connected with the substrate web 202. The substrate web 205 and the substrate web 202 are in contact with each other at the ends thereof and then connected by welsion using the welding jig 209b.

Figure 2J:
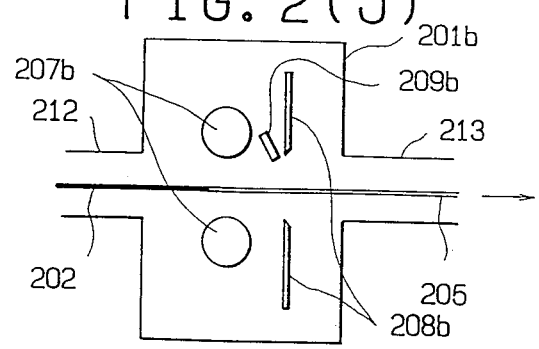

FIG. 2(J) shows a state in which the inside of the terminal substrate web container (not shown) is evacuated to reduce the pressure difference with the third film-forming chamber sufficiently and thereafter, the rollers 207b are aparted from the substrate web 202 and the wall of the second substrate web processing chamber 201b and the substrate webs 202 and 205 are being taken up.

As shown in FIG. 2, since the substrate web can be replaced by another substrate web easily while maintaining the evacuated state in the film-forming chamber, the operation efficiency can be remarkably improved. In addition, since the inside of the film-forming chamber is not exposed to the atmospheric pressure, there is not any occasion for the inner wall of the film-forming chamber to be wetted with water, thereby enabling to stably prepare semiconductor devices of high quality.

In the present invention, the inside of the film-forming chamber can be cleaned as required by means of dry etching while maintaining the evacuated state.

SECOND EMBODIMENT

Figure 8:
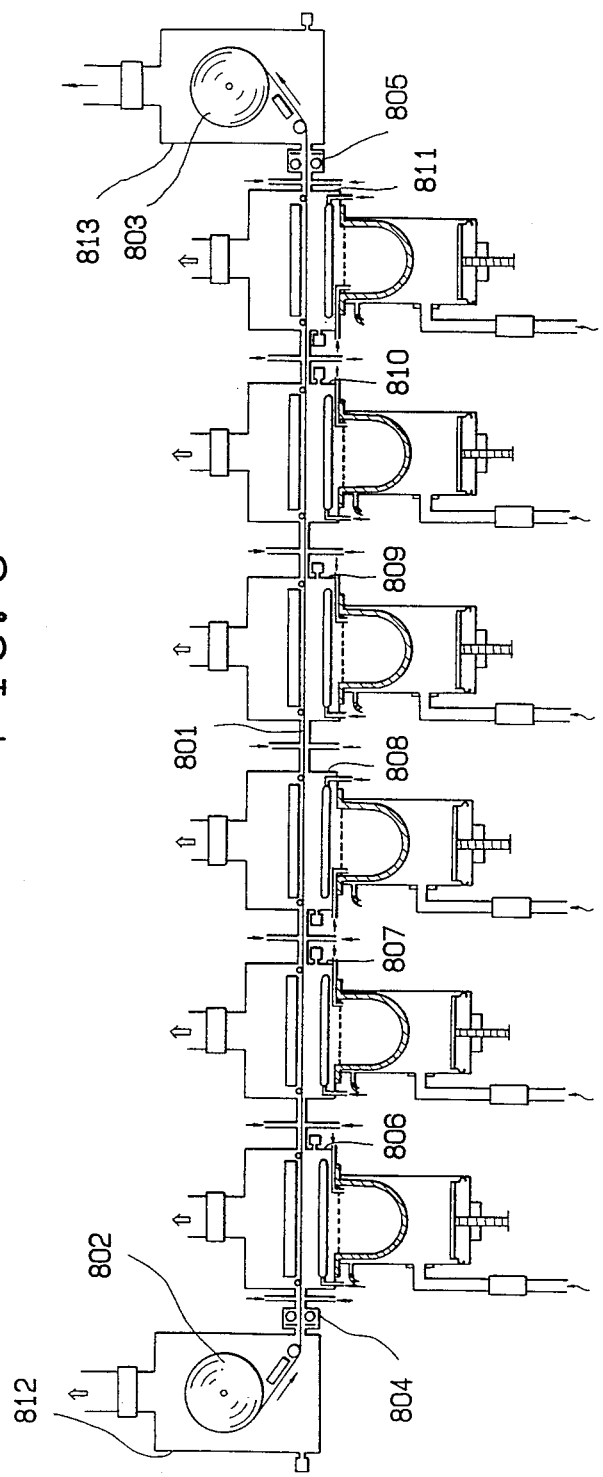
FIG. 8 is a schematic cross sectional view for the constitution of another embodiment of the apparatus for continuously forming semiconductor devices according to the present invention, in a case of forming a semiconductor device comprising six semiconductor layers being stacked.

FIG. 8 is a schematic cross sectional view illustrating another apparatus for continuously preparing semiconductor devices according to the present invention, which enables one to continuously produce semiconductor devices of six-layered structure.

In the figure, numeral reference 801 stands for a substrate web, which is paid-out by a pay-out mechanism 802 in a initial substrate web container 812 and then taken up by a take-up mechanism 803 in a terminal substrate web container 813. Numeral references 806, 807, 808, 809, 810 and 811 stand for 1st, 2nd, 3rd, 4th, 5th and 6th film-forming chambers, respectively, in which different semiconductor layers are formed in the respective film-forming chambers, and semiconductor devices each of a six-layered structure are prepared continuously. The structure of each of the film-forming chambers and the structure of the connection pipes are the same as those shown in First Embodiment.

Numeral references 804 and 805 stand for substrate web processing chambers, respectively, which function in the same ways as those shown First Embodiment.

EXPERIMENTS

Studies have been made on the conditions such as distance and angle, with which the substrate web is to be disposed relative to the porous metal thin plate and which are required for unifying the quality and properties of semiconductor thin films formed continuously on a substrate web by using the apparatus according to the present invention.

Upon examination, an a-Si:H:F film as the group IV semiconductor was formed by using the apparatus shown in FIG. 1 and moving the substrate web at a speed of 50 cm/min.

By using the apparatus according to the present invention, it is possible to set a plurality of film-forming conditions independently in each film-forming chamber while maintaining the evacuated state. That is, it is possible to change the film-forming conditions on every certain period of time and continuously form deposited films under a plurality of film-forming conditions on a substrate web.

It is desirable that the cross sectional form of the cavity resonator and that of the microwave permeable bell jar in parallel with the surface of the substrate web used in the apparatus according to the present invention have, preferably, a circular shape, in view of the excitation mode of the microwave (TM mode) and, accordingly, generated atomic hydrogens are supplied in a substantially circular projection plane into the film-forming chamber.

Figure 3:
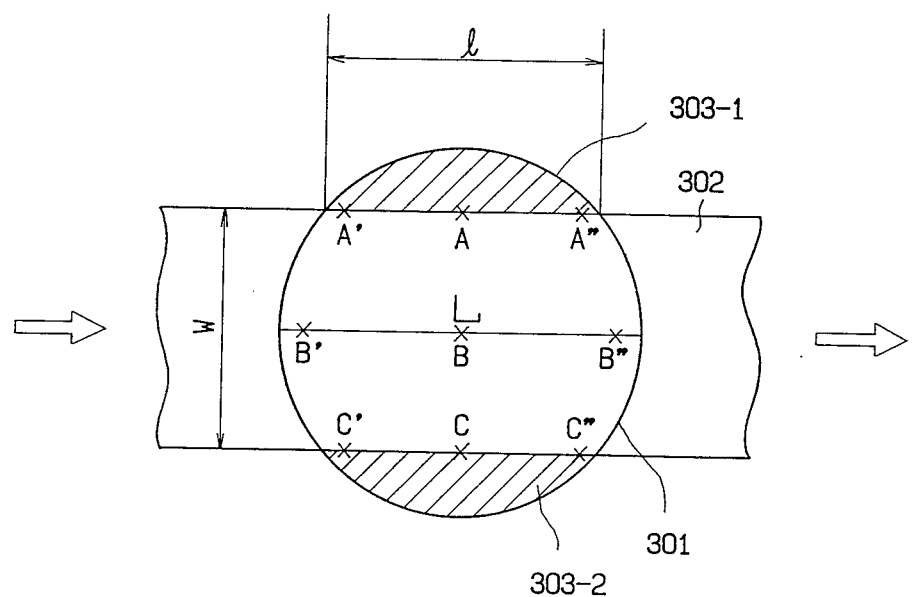
FIG. 3 is a view schematically showing a positional relationship between the cross section of a bell jar and a substrate web in the present invention.

FIG. 3 is a view illustrating a positional relationship between the cross section of the bell jar and the substrate web. As can be seen from FIG. 3, in the case where the substrate web 302 of width W moves in the direction of arrow (→) relative to the projected plane 301 of the bell jar cross section on the substrate web 302, the distance along which the substrate web 302 moves within the projected plane 301 is different such that it is "L" in the central portion, whereas it is "l" at the ends of the substrate web 302, in correlationship with the width W of the substrate web 302. Further, since the substrate is not present in the portions depicted as hatched areas 303-1, and 303-2 in the figure, they constitute loss areas relative to the effective deposited film forming area upon forming deposited films, which also has a correlationship with the width W of the substrate web 302. It is, accordingly, necessary to properly select the width W of the substrate web, as well as control the deposition rate at the central portions (B, B', B") and at the ends (A, A', A", C, C', C").

As concrete reference values, each of values concerned with the diameter L for the projected plane 301 assumed as L=100 is shown in Table 1. Based on the values, examinations were conducted by means of subsequent tests.

Experiment 1

(Distance between substrate web and porous metal thin plate)

Figure 4:
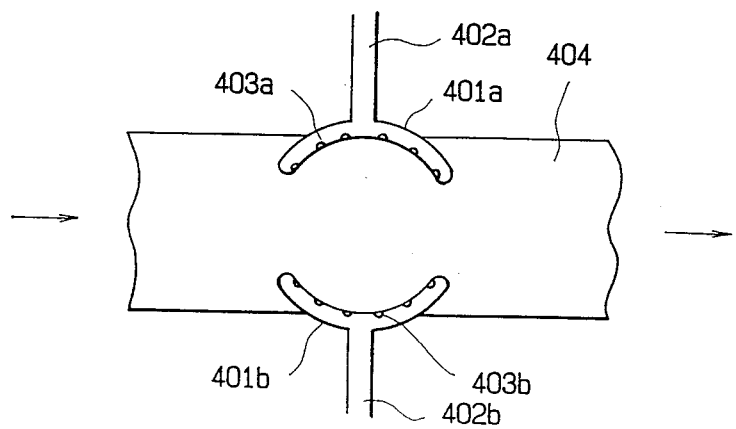
FIG. 4 is a view schematically showing the relationship between a gas blowing means and a substrate web in the present invention.

Examination was made by using the apparatus shown in FIG. 1 and means for feeding a film-forming raw material gas as shown in FIG. 4.

The gas feed means shown in FIG. 4 comprise a pair of gas feed rings 401a and 401b. The gas feed ring 401a is provided with a plurality of gas liberation holes 403a and it is connected through a gas introducing pipe 402a to a reservoir (not shown). Likewise, the gas feed ring 401b is provided with a plurality of gas liberation holes 403b and it is connected through a gas introducing pipe 402b to a reservoir (not shown). Each of the gas feed rings 401a and 401b is provided such that a film-forming raw material gas is supplied in the direction vertical to the moving direction of a substrate web 404 (in the direction shown by arrows in the figure).

Figure 5:
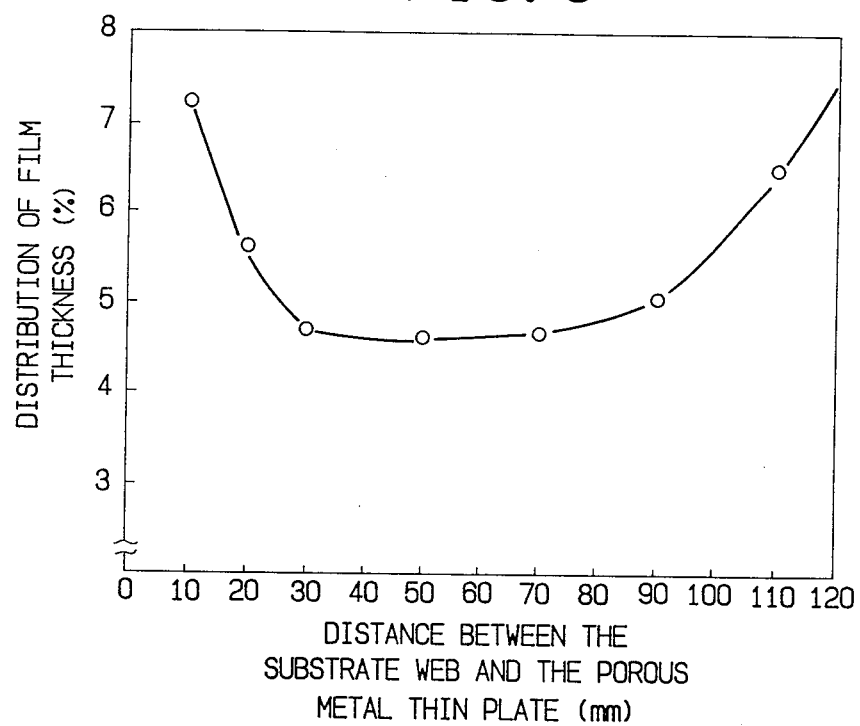
FIG. 5 is a graph showing the relationship of film thickness distribution relative to a distance between a substrate web and a porous metal thin plate.

FIG. 5 shows the change of distribution of film thickness between A, B and C relative to the distance between the substrate web having an a-Si:H:F film formed under the film-forming conditions shown in Table 2 and the porous metal thin plate.

As can be seen from what shown in FIG. 5, as the distance is increased between the substrate web and the porous metal thin plate, the film thickness distribution is improved up to about 10 to 30 mm and substantially constant up to about 30 to 90 mm of the distance. However, as it increases exceeding 90 mm, the film thickness distribution is worsened. Further, when it exceeds 90 mm, the deposition rate is abruptly decreased and no practically suitable semiconductor thin film can be formed. This situation was more or less around the same also in the cases of using other film-forming conditions.

Experiment 2

Angle between substrate web and porous metal thin plate)

Changes of film thickness distribution were examined under the same film-forming conditions as in Experiment 1 by varying the angle of the web substrate relative to the horizontal plane of the porous metal thin plate.

Figure 6:
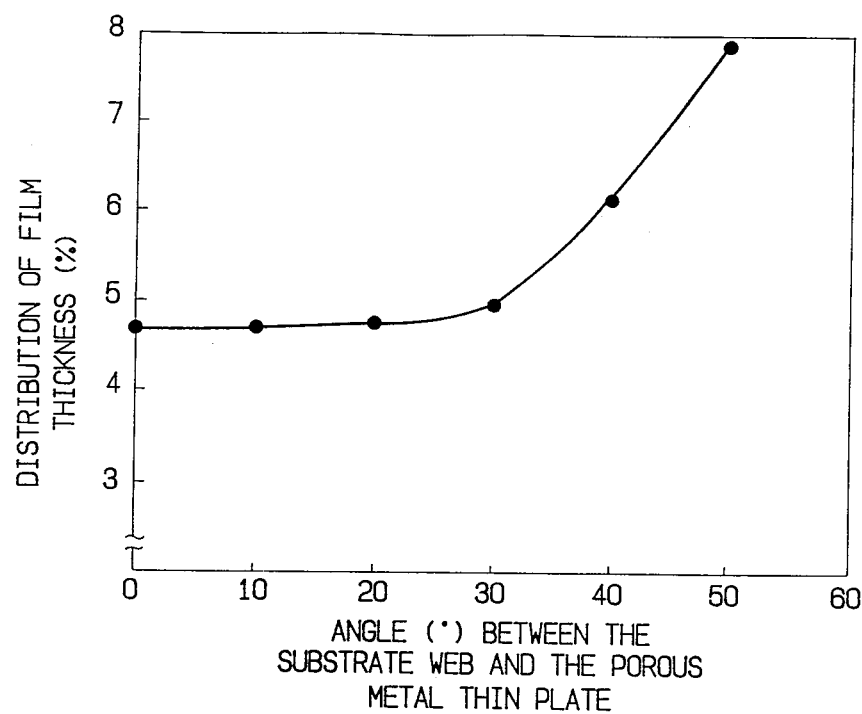
FIG. 6 is a graph showing the relationship of film thickness distribution relative to an angle between the substrate web and the porous metal thin plate.

FIG. 6 shows the changes of the film thickness distribution between A, B and C when an a-Si:H:F film was formed on the substrate web shown in FIG. 3 by varying the angle between the substrate web and the porous metal thin plate in the case where the distance between the substrate web and the porous metal thin plate is made to be 50 mm. As can be seen from FIG. 6, the film thickness distribution is abruptly worsened at a point where the angle between the substrate web and the porous metal thin plate exceeds 30°. More or less around the same tendency also found in the cases where the distance between the substrate web and the porous metal thin film was varied and also in other cases where the film-forming conditions were changed.

Experiment 3

(Amount of rare gas introduced from connection pipe)

Changes of the film-thickness distribution between A, B and C shown in FIG. 3 were examined at an angle of 0°, under the same film-forming conditions as those in Experiment 2 while varying only the amount of Ar as a rare gas to be introduced from the gas gate disposed to the connection pipe. The results obtained were as shown in FIG. 7.

Figure 7:
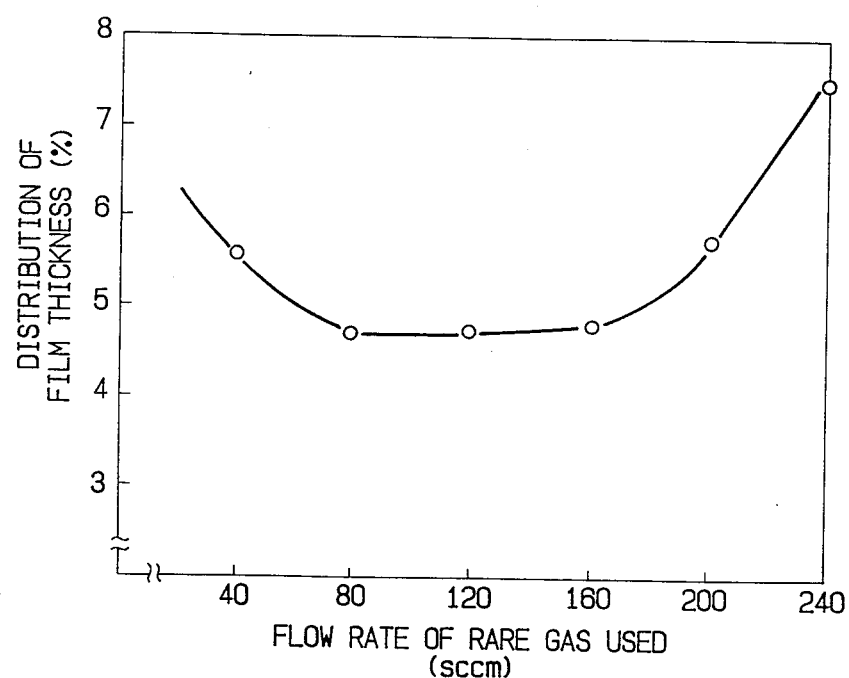
FIG. 7 is a graph showing the relationship between the amount of a rare gas introduced and film thickness distribution in the present invention.

As can be seen from FIG. 7, along with the increase in the amount of the rare gas introduced, the film thickness distribution is improved starts improving from the point near 40 sccm, and it is substantially constant as far as about 160 sccm, but abruptly worsened in excess of 200 sccm. It is considered that precursors etc. capable of contributing to the formation of a semiconductor thin film are flown out by the entrance of the rare gas into the film-forming chamber along with the increase in the amount of the rare gas introduced. This situation was found also under other film-forming conditions.

Further, when the absence or presence of contamination caused by the film-forming raw material gases used in other film-forming chambers under different film-forming conditions was examined based on elemental analysis of the resultant semiconductor thin films by SIMS, no trace of contamination was observed within the above-mentioned range of the flow rate.

From the results obtained in Experiments 1 through 3, it has been found, as necessary conditions, in the present invention that the distance between the substrate web and the porous metal thin plate be set to preferably less than 100 mm, more preferably, less than 80 mm and the angle between the substrate web and the surface of the porous metal thin plate be set, preferably, within 30°, more preferably, within 20° in view of obtaining a desired film thickness distribution. It has also been found that the film thickness distribution can be improved and contamination of the film-forming raw material gases between the adjacent film-forming chambers can be effectively prevented by supplying a rare gas into the gas gate.

In the present invention, the inner pressure of the film-forming space upon film formation can properly be determined while having due regards on the conditions for stably forming microwave plasmas of a hydrogen gas or a gaseous mixture composed of a hydrogen gas and a selected rare gas, the kind and the state of a film-forming raw material to be used, and the kind and the state of a raw material capable of imparting a valence electrons controlling element to be used, as well as required properties for the deposition film to be formed, etc. However, in general, it is preferably, from 100 to $1 \times 10^{-4}$ Torr and, more preferably, from 10 to $5 \times 10^{-4}$ Torr and most preferably, from 1 to $1 \times 10^{-3}$ Torr.

In the apparatus according to the present invention, amorphous or crystalline semiconductor thin films having desirable crystaillity can be formed continuously on an optional substrate web to obtain semiconductor devices.

In the present invention, the oscillation mode of a microwave oscillator is, desirably, continuous oscillation and the ripple amplitude in the output region used is preferably within 30% and, more preferably, within 10% for stably establishing cavity resonance conditions.

According to the present invention, it is possible to form hydrogen atoms in the excited state with good controllability, stably and at good reproducibility by microwave plasmas using a cavity resonator integrated with two impedance matching circuits in a microwave circuit, to improve the reaction controllability between the hydrogen atoms in the excited state and the film-forming raw material gas, as well as to form semiconductor thin films having a desired crystallinity, a desired hydrogen content, etc., continuously at a good homogenity, high efficiency and good reproducibility.

Embodiments for preparing a semiconductor device by using the apparatus in accordance with the present invention are to be described below, but it should be noted that the present invention is no way limited to these preparation examples.

Preparation Example 1

There was prepared a pin type photoelectromotive force element comprising a p-type semiconductor layer, an i-type semiconductor layer and an n-type semiconductor layer by using the apparatus shown in FIG. 1.

A substrate web made of stainless steel of 150 mm in width, 0.25 mm in thickness and 200 m in length having a surface applied with a surface treatment of Ag and Zn on which a film is to be formed was placed between the substrate web pay-out mechanism 102 and the take-up mechanism 103, the insides of the 1st, 2nd and 3rd film-forming chambers 104, 105 and 106 and the insides of the initial and terminal substrate web containers 107 and 108 were evacuated by way of exhaust pipes 162, 163, 164, 168 and 169 to bring them to a vacuum of about $1 \times 10^{-4}$ Torr. Since this preparation was carried out after exposing all of the film-forming chambers and the substrate web containers to atmospheric air, about 8 hours were required for reaching a desired vacuum degree.

Meanwhile, the position for the support rollers 111, 112, 113, 114, 115 and 116 were adjusted such that the substrate web 101 and the porous metal thin plates 141, 142 and 143 are in parallel to each other in each of the film-forming chambers and the distance between them is 50 mm in the 1st film-forming chamber 104, 40 mm in the 2nd film-forming chamber 105 and 30 mm in the 3rd film-forming chamber 106. The heating mechanism 183 was heated to maintain at 420° C., while the film-forming heating mechanisms 159, 160 and 161 were heated to maintain at 350° C., 320° C. and 300° C., respectively.

Subsequently, $H_2$ gas and He gas were fed through the gas feed pipe 150 at respective flow rates of 150 sccm and 80 sccm in the 1st film-forming chamber 104, through the gas feed pipe 151 at respective flow rates of 120 sccm and 150 sccm in the 2nd film-forming chamber 105, and through the gas feed pipe 152 at respective flow rates of 200 sccm and 50 sccm. Concurrently, through each of the gas gates 177, 178, 179 and 180, Ar gas was introduced at a flow rate of 250 sccm. Then, each of the pressure controlling valves 165, 166, 167, 170 and 171 was regulated to adjust the inner pressures of the 1st, 2nd and 3rd film-forming chambers 104, 105 and 106 and also the inner pressures of the initial and terminal substrate web containers 107 and 108 to 0.045 Torr, 0.03 Torr, 0.02 Torr, 0.035 Torr and 0.035 Torr, respectively.

When all the flow rates and the inner pressures became stable, microwave was applied to the inside for each of the cavity resonators 117, 118 and 119 from the microwave oscillator (not illustrated) disposed to each of the film-forming chambers (within 5% of ripple amplitude) through each of the rectangular waveguides 123, 124 and 125. Directly, each of the cavity length variable plungers 132, 133 and 134 was actuated by motors 135, 136 and 137 respectively to such a position as to minimize the ratio of reflection power/incident power measured by a power monitor disposed in a microwave circuit (not shown) and, further, the opening degree for each of the restrictions, 129, 130 and 131 was made to such a position as minimizing the ratio of reflection power/incident power. The operations of finely controlling the position for each of the cavity length variable plungers 132, 133 and 134 and the opening degree of each of the restrictions 129, 130 and 131 were repeated such that the ratio of reflection power/incident power was minimized and the value of the effective incident power represented by: incident power - reflection power was 300 W in the 1st film-forming chamber 104 and 250 W in the 2nd film-forming chamber 105 and 500 W in the 3rd film-forming chamber 106.

In this instance, the intensity ratio between the light emission line of $H_\alpha$ and that of $H_\beta$ from the hydrogen atoms in the excited state in the microwave plasmas monitored from each of the ports 144, 145 and 146 were 120, 180 and 75 respectively.

For the porous metal thin plates 141, 142 and 143, punched metal boards were used, each made of aluminum with an entire outer diameter of 160 mm and having 60% porosity in which apertures of 8 mm $\phi$ were uniformly distributed.

As for each of the gas feed pipes 156, 157 and 158, there were used a pair of the gas feed rings 401a and 401b shown in FIG. 4, each of which having a plurality of gas liberation holes 403a or 403b of 1.5 mm in diameter and those gas liberation holes being 30 % in diameter increasing ratio.

Soon after the microwave plasmas as generated became stable, in the 1st film-forming chamber 104, through the foregoing pair of gas feed rings disposed at the position of 10 mm apart from the porous metal thin plate, $Si_2F_6$ gas, $Si_2H_6$ gas and $PH_3$ gas (diluted with $H_2$ gas to 2000 ppm) were introduced at respective flow rates of 5 sccm, 10 sccm and 12 sccm and the substrate web 101 was soon moved slidingly at a sliding rate of 1.5 cm/sec. Thus, there was formed an n-type a-Si:H:F semiconductor film of 350 Å on the substrate web 101.

Successively, in the 2nd film-forming chamber 105, $SiF_4$ gas was introduced at a flow rate of 250 sccm into a gas introducing pipe provided with a quartz furnace containing Si particles heated to 1150° C. (not shown) externally positioned and which is connected to the foregoing pair of gas feed rings placed at the 10 mm apart from the porous metal thin plate 142, to thereby generate $SiF_2$ radicals which were fed through said pair of gas feed rings.

Thus, there was formed a non-doped i-type a-Si:H:F semiconductor film of 4000 Å in thickness on the previously formed n-type semiconductor film.

Then, in the 3rd film-forming chamber 106, through the foregoing pair of gas feed rings placed at the position of 5 mm apart from the porous metal thin plate 143, $SiH_2F_2$ gas and $BF_3$ gas (diluted with He gas to 3000 ppm) were fed at respective flow rates of 10 sccm and 10 sccm.

Thus, there was formed a $p^+$-type a-Si:H:F semiconductor film of 200 Å in thickness on the previously formed i-type semiconductor film.

In this way, there were continuously formed pin type photoelectromotive force elements each comprising the foregoing n-type, i-type and p-type semiconductor films being stacked in this order on the substrate web of 200 m length. Then, this substrate web was taken out and a new substrate web was set to the apparatus by the foregoing substrate web exchanging method.

Then, from the substrate web thus taken out, solar cell modules each of 13 cm×25 cm were continuously prepared by a conventional roll-to-roll continuous moduling device.

When the properties of the solar cell modules thus obtained were evaluated by irradiation of AM1.5 (100 mW/cm$^2$) light, more than 9% of photoelectric conversion efficiency could be obtained and the differences in the properties among the modules were within 5%.

Comparative Example

The procedures of Preparation Example 1 were repeated, except that the evacuation period after placing the substrate web in the apparatus was changed to one hour and the vacuum degree at that time was changed to about $1 \times 10^{-2}$ Torr, to thereby continuously form a plurality of pin type photoelectromotive force elements on the substrate web of 200 m length.

And a plurality of solar cell modules were prepared in the same manner as in Preparation Example 1.

When the properties of the solar cell modules thus prepared were evaluated by irradiation of AM 1.5 (100 mW/cm$^2$) light, their photoelectric conversion efficiencies were about 7 to 8%. The differences in the properties were more than 10% between those prepared at the beginning stage and those prepared just before the termination of film formation.

Further, when the amount of impurities contained in each of the i-type layers in the thus obtained photoelectromotive force elements was quantitatively determined by SIMS. As a result, it was found that both 0 (oxygen atom) and C (carbon atom) were present by more than 50% as compared with those formed in Preparation Example 1.

Preparation Example 2

A plurality of pin type photoelectromotive force elements and a plurality of solar cell modules were prepared in the same procedures as in Preparation Example 1, except that the substrate web made of stainless steel used in Preparation Example 1 was replaced by a substrate web of the same size but made of PET (polyethylene terephthalate) film, the preheating mechanism 183 was adjusted to 250° C., and each of the heating mechanisms 159, 160 and 161 for film formation was adjusted to 220° C., 200° C. and 180° C. respectively.

When the properties of the solar cell modules thus prepared were evaluated by irradiation of AM 1.5 (100 mW/cm$^2$) light, more than 8% of photoelectric conversion efficiency was obtained, and the differences in the properties among the modules were within 5%.

In this preparation example, it has been recognized that a desirable photoelectromotive force element of high photoelectric conversion efficiency can be continuously and easily formed even on an inexpensive resin film.

Preparation Example 3

The procedure of Preparation Example 1 were repeated to continuously form a plurality of pin type photoelectromotive force elements on a stainless steel substrate web of 200 m length, except that: in the 1st film-forming chamber 104, in stead of the $Si_2F_6$, $Si_2H_6$ and $PH_3/He$ gases, there were supplied a gas caused by introducing He gas as a carrier gas at a flow rate of 50 sccm into a solution containing $Ga(CH_3)_3$ and $Te(CH_3)$ with the quantitative ratio of $1 \times 10^4:1$ contained in a bubbling vessel (not shown) connected to the gas introducing pipe 153 and $AsH_4$ gas at a flow rate of 24 sccm; in the 2nd film-forming chamber 105, in stead of the $SiF_4$ gas, there were supplied a gas caused by introducing He gas as a carrier gas at a flow rate of 50 sccm into a solution containing $Ga(CH_3)_3$ and $Zn(CH_3)_2$ with the quantitative ratio of $1 \times 10^4:1$ contained in a bubbling vessel (not shown) connected to the gas introducing pipe 154 and $AsH_4$ gas at a flow rate of 20 sccm; and in the 3rd film-forming chamber 106, in stead of the $SiH_2F_2$ gas and $BF_3/He$ gas, there were supplied a gas caused by introducing He gas as a carrier gas at a flow rate of 50 sccm into a solution containing $Ga(CH_3)_3$, $Al(CH_3)_3$ and $Te(CH_3)_2$ with the quantitative ratio of $1 \times 10^{-3}:1 \times 10^{-4}:1$ contained in a bubbling vessel (not shown) connected to the gas introducing pipe 155 and $AsH_4$ gas at a flow rate of 22 sccm. The distance between the substrate web 101 and each of the porous metal thin plates 141, 142 and 143 was set to 40 mm respectively. Hydrogen gas and He gas were introduced at respective flow rates of 150 sccm and 100 sccm through the gas introduction pipes 150, 151 and 152 respectively. The microwave power applied was set to 400 W and the inner pressure of each of the 1st, 2nd and 3rd film-forming chambers was set to 0.05, 0.08 and 0.06 Torr respectively. Further, the sliding speed of the substrate web was set to 1.1 cm/sec. With the exception as described above, a plurality of pin type photoelectromotive force elements each having a three-layer structure comprising an n-type GaAs film, an i-type GaAs film and a p-type AlGaAs film were continuously formed.

Then, a plurality of solar cell modules each of 13 cm 25 cm were continuously prepared in the same manner as in Preparation Example 1.

When the properties of the solar cell modules thus prepared were evaluated by irradiation of AM 1.5 (100 $mW/cm^2$) light, more than 24% of photoelectric conversion efficiency was obtained and the differences in the properties among the modules were within 5%.

Preparation Example 4

The procedures of Preparation Example 1 were repeated to continuously form a plurality of pin type photoelectromotive force elements on a stainless steel substrate web of 200 m length except that: at the time of forming the i-type semiconductor film, the flow rate of the $Si_F$ gas was changed to 200 sccm and $GeF_4$ gas (diluted with He gas to 10 %) was supplied at a flow rate of 25 sccm to thereby form an i-type non-doped a-Si:Ge:H:F semiconductor film.

And a plurality of solar cell modules were continuously prepared in the same manner as in Preparation Example 1.

When the properties of the solar cell modules thus prepared was evaluated by irradiation of AM 1.5 (100 $mW/cm^2$) light, more than 8.5% of photoelectric conversion efficiency was obtained, and the differences in the properties among the modules was within 5%.

When the composition ratio of Si:Ge in the a-Si:-Ge:H:F film was determined by XMA, Si:Ge was 51:49.

Preparation Example 5

There were continuously formed a plurality of so-called tandem type photoelectromotive force elements each comprising two cells each constituted by an n-type, i-type and p-type semiconductor films being stacked in this order on a stainless steel substrate web of 200 m length, using the apparatus shown in FIG. 8.

The first cell was formed in the first three film-forming chambers 806, 807 and 808 by repeating the procedures of Preparation Examples 4. The second cell was formed in the remaining film-forming chambers 809, 810 and 811 by repeating the procedures of Preparation Example 1.

In each of the film forming chambers 806 to 811, the temperature upon film formation was adjusted to 350° C., 320° C., 300° C., 300° C., 270° C. and 250° C., respectively.

Then, a plurality of solar cell modules each of 13 cm $\times 25$ cm were continuously prepared in the same manner as in Preparation Example 1.

When each of the solar cell modules thus prepared was evaluated by irradiation of AM 1.5 (100 $mW/cm^2$) light, more than 10% of photoelectric conversion efficiency was obtained, and the differences in the properties among the modules was within 5%.

Separately, the above procedures were repeated to continuously prepare tandem type photoelectromotive force elements on 10 rolls of the substrate webs and solar cell modules were continuously prepared from them.

As a result of evaluating each of the solar cell modules thus prepared, it was found that each of them provides a photoelectric conversion efficiency of more than 10 % and the differences in the properties among the modules were within 5 %.

Then, deposited films adhered to the walls of the film-forming chambers, etc. were removed by dry etching by introducing $ClF_3$ gas diluted with Ar gas to 10% at a flow rate of 400 sccm from the gas introduction pipe to each of the film-forming chambers while adjusting the inner pressures of the film-forming chambers to 1.2 Torr. The time required for the removal was about 30 min. Successively, the inside of each of the film-forming chambers was evacuated to about $1 \times 10^{-6}$ Torr and then new substrate web was placed by the foregoing exchanging method and tandem type photoelectromotive force elements were continuously prepared again.

The solar cell modules prepared from the substrate web provided satisfactory results.

Further, when the amount of defects such as pinholes present in the solar cell modules formed in Preparation Examples 1 to 5 was examined by means of a short-circuit current path detector (as disclosed in Japanese Patent Laid-Open Sho 60-46080), it was reduced by more than 50% as compared with that in the module formed by the conventional plasma CVD apparatus.

TABLE 1

| | | | | | | |
|---|---|---|---|---|---|---|
| diameter (L) (standard value) | 100 | 100 | 100 | 100 | 100 | 100 |
| width of substrate web | 95 | 90 | 80 | 70 | 60 | 50 |

TABLE 1-continued

| (W) (relative value) | | | | | | |
|---|---|---|---|---|---|---|
| minimum moved distance (l) (relative value) | 31.2 | 43.6 | 60 | 71.4 | 80 | 86.6 |
| ratio of moved distances (L/l) | 3.21 | 2.29 | 1.67 | 1.40 | 1.25 | 1.15 |
| loss proportion* (%) | 1.34 | 3.72 | 10.4 | 18.8 | 28.5 | 39.1 |

*loss proportion = loss area/effective film-formed area × 100

TABLE 2

| film-forming conditions | |
|---|---|
| substrate temperature | 200° C. |
| film-forming raw material gas | $SiH_2F_2$: 15 sccm |
| hydrogen atoms-generating raw material gas | $H_2$: 80 sccm<br>Ar: 120 sccm |
| inner pressure of the film-forming chamber | 0.035 Torr |
| inner pressure of the containers | 0.0 Torr |
| flow rate of a rare gas passed into the gas gate | Ar: 80 sccm |
| porous metal thin plate | panched aluminum board of 120 mm in diameter and having 60% porosity in which apertures of 8 mm in size are uniformly distributed |
| position of the gas feed pipe disposed | 10 mm apart from the panched board |
| substrate web and its size | made of a stainless steel, 110 mm(width) × 50 m (length) × 0.3 mm(thickness) |
| miocrowave power applied | 400 W |

What we claim is:

1. An apparatus for continuously preparing semiconductor devices each comprising a plurality of semiconductor layers being stacked on a moving substrate web; said apparatus comprising a plurality of film-forming chambers by a number equal to the number of said stacked semiconductor layers, each of said film-forming chambers having a film-forming space and being provided with means for evacuating said film-forming space, means for supporting said substrate web in said film-forming space, means for maintaining said substrate web at a desired temperature and means for supplying a film-forming raw material gas into said film-forming space; each of said film-forming chambers being provided with a plasma-generating chamber for generating a plasma reactive with said film-forming raw material gas to cause the formation of a semiconductor film on said substrate web in said film-forming space; said plasma-generating chamber comprising a microwave permeable bell jar disposed in a cavity resonator integrated with two impedance matching circuits in a microwave circuit, said plasma-generating chamber being provided with a porous metal thin plate adjacent to said means for supplying a film-forming raw material gas, said plasma-generating chamber being provided with means for supplying a plasma-generating raw material gas selected from the group consisting of a hydrogen gas and a gaseous mixture composed of a hydrogen gas and a rare gas into said plasma-generating chamber; said apparatus being provided with a substrate web pay-out chamber provided with a mechanism for paying out said substrate web and a substrate take-up chamber provided with a mechanism for taking up said substrate web; said apparatus being provided with a substrate web-processing chamber at least between said substrate web pay-out chamber and the first film-forming chamber; each two of said chambers being connected by means of a connection pipe through which said substrate web can be moved; and said connection pipe being provided with means for preventing the gas of one of said chambers from entering into other chamber with an inert gas.

2. The apparatus according to claim 1, wherein the impedance matching circuit in the cavity resonator integrated with the two impedance matching circuits in the microwave circuit comprises a cavity length variable plunger and a restriction disposed at a connection portion between a microwave guide and the cavity resonator and impedance matching conditions are controlled by adjusting them.

3. The apparatus according to claim 2, wherein the impedance matching circuit comprises the cavity length variable plunger and an E-H tuner or three-stub tuner.

4. The apparatus according to claim 1, wherein the excited state of the hydrogen atoms is controlled by measuring the light emission intensity of $H_\alpha$, $H_\beta$ as the excited state of hydrogen by emission spectroscopy, and controlling one or more parameters selected from the group consisting of the power of the microwave applied into the cavity resonator, the impedance matching conditions, the flow rate of said plasma-generating raw material gas and the total pressure, so as obtain a desired value of the intensity ratio.

5. The apparatus according to claim 1, wherein the substrate web is moved at an angle within 30° relative to the horizontal axis on the surface of the porous metal thin plate and at a position within 100 mm from the surface of said porous metal thin plate, and the film-forming raw material gas is introduced from gas blowing means disposed between the porous metal thin plate and the substrate web.

6. The apparatus according to claims 1, wherein at least vacuum sealing jig, substrate web cutting jig and substrate web connecting jig are incorporated in the substrate web processing chamber.

7. The apparatus according to claim 1, wherein said means for preventing the gas one of the chambers from entering into other chamber comprises a gas gate through which an inert gas is passed.

* * * * *

UNITED STATES PATENT AND TRADEMARK OFFICE
CERTIFICATE OF CORRECTION

PATENT NO. : 4,951,602
DATED : August 28, 1990
INVENTOR(S) : MASAHIRO KANAI

It is certified that error appears in the above-identified patent and that said Letters Patent is hereby corrected as shown below:

ON THE TITLE PAGE:

IN [30] FOREIGN APPLICATION PRIORITY DATA

"58-299585" should read --63-299585--.

IN [56] REFERENCES CITED

Attorney, Agent, or Firm: "Fitzpatrick, Cella Harper & Scinto" should read --Fitzpatrick, Cella, Harper & Scinto--.

IN [57] ABSTRACT

Line 7, "beingprovided" should read --being provided--.
Line 8, "means For" should read --means for--.

COLUMN 1

Line 65, "repeatingly, on" should read --repeatedly--.
Line 66, "in adjacent with" should read --adjacent to--.

COLUMN 2

Line 1, "much step" should read --strict control of the production steps -- and" and "also in" should be deleted.

COLUMN 3

Line 9, "undergo" should read --undergoes--.
Line 27, "dissolving" should read --solving--.

UNITED STATES PATENT AND TRADEMARK OFFICE
CERTIFICATE OF CORRECTION

PATENT NO. : 4,951,602
DATED : August 28, 1990
INVENTOR(S) : MASAHIRO KANAI

It is certified that error appears in the above-identified patent and that said Letters Patent is hereby corrected as shown below:

COLUMN 4

Line 33, "laYer" should read --layer--.
Line 36, "in" should be deleted.

COLUMN 5

Line 4, "tact" should read --efficiency--.
Line 20, "stacked" should read --stacked.--.
Line 23, "invention" should read --invention.--.

COLUMN 6

Line 50, "stab" should read --stub--.

COLUMN 7

Line 20, "introducing" should read --introduce--.

COLUMN 8

Line 28, "formed" should read --formed.--.

COLUMN 9

Line 2, "threelayered" should read --three-layered--.
Line 4, "subs&rate" should read --substrate--.
Line 43, "robber," should read --rubber,--.
Line 48, "mixing each" should read --mixing with each--.
Line 50, "17" should read --176--.

COLUMN 10

Line 41, "bel jar" should read --bell jar--.

UNITED STATES PATENT AND TRADEMARK OFFICE
CERTIFICATE OF CORRECTION

PATENT NO. : 4,951,602

DATED : August 28, 1990

INVENTOR(S) : MASAHIRO KANAI

Page 3 of 4

It is certified that error appears in the above-identified patent and that said Letters Patent is hereby corrected as shown below:

COLUMN 11

Line 28, "deliverying" should read --delivering--.

COLUMN 12

Line 3, "welsion" should read --welding--.
    Line 8, "aparted" should read --separated-- and "wet" should read --web--.
    Line 42, "atmospheric" should read --atmosphere--.
    Line 48, "welsion" should read --welding--.
    Line 53, "aparted" should read --separated--.

COLUMN 14

Line 36, "what shown" should read --what is shown--.
    Line 67, "around the same tendency also found" should read --the same tendency also is found--.

COLUMN 15

Line 16, "is improved starts" should read --is improved and starts--.

COLUMN 17

Line 55, "at the" should be deleted.

COLUMN 18

Line 42, "SIMS. As a result," should read --SIMS,-- and "0" should read --O--.

UNITED STATES PATENT AND TRADEMARK OFFICE
CERTIFICATE OF CORRECTION

PATENT NO. : 4,951,602

DATED : August 28, 1990

INVENTOR(S) : MASAHIRO KANAI

It is certified that error appears in the above-identified patent and that said Letters Patent is hereby corrected as shown below:

COLUMN 19

Line 3, "were" should read --was--.
    Line 7, "in stead" should read --instead--.
    Line 14, "in stead" should read --instead--.
    Line 21, "in stead" should read --instead--.
    Line 67, "was" should read --were--.

COLUMN 20

Line 9, "an" should be deleted.

Column 22 claim 6 Line 49, "claims 1," should read --claim 1,--.
claim 7 Line 54, "gas one" should read --gas of one--.

Signed and Sealed this

Eighteenth Day of May, 1993

Attest:

MICHAEL K. KIRK

Attesting Officer      Acting Commissioner of Patents and Trademarks